(12) United States Patent
Handa et al.

(10) Patent No.: US 11,417,851 B2
(45) Date of Patent: Aug. 16, 2022

(54) LIGHT-EMITTING ELEMENT, LIGHT-EMITTING DEVICE, AND DEVICE FOR PRODUCING LIGHT-EMITTING ELEMENT

(71) Applicant: SHARP KABUSHIKI KAISHA, Sakai (JP)

(72) Inventors: Shinichi Handa, Sakai (JP); Yoshihiro Ueta, Sakai (JP); Noboru Iwata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 104 days.

(21) Appl. No.: 16/968,059

(22) PCT Filed: Feb. 13, 2018

(86) PCT No.: PCT/JP2018/004915
§ 371 (c)(1),
(2) Date: Aug. 6, 2020

(87) PCT Pub. No.: WO2019/159236
PCT Pub. Date: Aug. 22, 2019

(65) Prior Publication Data
US 2021/0057662 A1 Feb. 25, 2021

(51) Int. Cl.
*H01L 51/50* (2006.01)
*H01L 51/56* (2006.01)

(52) U.S. Cl.
CPC ........ *H01L 51/502* (2013.01); *H01L 51/5056* (2013.01); *H01L 51/5088* (2013.01); *H01L 51/56* (2013.01)

(58) Field of Classification Search
CPC .... H01L 51/502; H01L 51/5056; H01L 51/56
See application file for complete search history.

(56) References Cited

U.S. PATENT DOCUMENTS

| 2007/0103068 A1 | 5/2007 | Bawendi et al. |
| 2012/0238047 A1 | 9/2012 | Bawendi et al. |
| 2012/0292595 A1 | 11/2012 | Bawendi et al. |
| 2013/0214249 A1 | 8/2013 | Pan et al. |
| 2017/0125635 A1 | 5/2017 | Bawendi et al. |

FOREIGN PATENT DOCUMENTS

| JP | 2012-023388 A | 2/2012 |
| JP | 2016-197601 A | 11/2016 |
| WO | 2006/088877 A1 | 8/2006 |

*Primary Examiner* — Anthony Ho
(74) *Attorney, Agent, or Firm* — ScienBiziP, P.C.

(57) ABSTRACT

A light-emitting element includes: a first electrode; a second electrode; a quantum dot layer including layered quantum dots between the first electrode and the second electrode; and a hole transport layer formed of LaNiO3 between the quantum dot layer and the first electrode.

9 Claims, 8 Drawing Sheets

LIGHT-EMITTING ELEMENT, LIGHT-EMITTING DEVICE, AND DEVICE FOR PRODUCING LIGHT-EMITTING ELEMENT

TECHNICAL FIELD

The present invention relates to a light-emitting element including quantum dots, a light-emitting device including the light-emitting element, and a manufacturing apparatus of a light-emitting element.

BACKGROUND ART

PTL 1 discloses a light-emitting device including a semiconductor nanocrystal. The light-emitting device of PTL 1 includes a light-emitting element including a hole transport layer formed of NiO, which is an inorganic material. The light-emitting device including the light-emitting element including the hole transport layer formed of the inorganic material is preferable in terms of improvement of reliability of the light-emitting device because the material itself is stable with respect to oxygen, moisture, ultraviolet light, and the like, as compared with a light-emitting device including a light-emitting element including a hole transport layer formed of an organic material.

CITATION LIST

Patent Literature

PTL1: JP 2012-23388 A (Feb. 2, 2012)

SUMMARY OF INVENTION

Technical Problem

In general, an ionization potential of the quantum dots is from 6 to 7 eV with reference to a vacuum level. Further, the ionization potential of NiO, which is an inorganic material, is 5.5 eV. Thus, a difference in ionization potential between NiO and the quantum dots is as great as from 0.5 to 1.5 eV.

Thus, in a light-emitting element including a conventional inorganic material in a hole transport layer and quantum dots in a quantum dot layer, efficiency of transport of positive holes from the hole transport layer to the quantum dot layer is poor. Therefore, in the light-emitting element adopting the conventional inorganic material in the hole transport layer, a balance between the efficiency of the transport of the positive holes from the hole transport layer to the quantum dot layer and efficiency of transport of electrons from an electron transport layer to the quantum dot layer becomes poor, leading to a decrease in luminous efficiency of the light-emitting element.

Solution to Problem

In order to solve the above problem, a light-emitting element of the present invention includes a first electrode, a second electrode, a quantum dot layer including layered quantum dots between the first electrode and the second electrode, and a hole transport layer formed of $LaNiO_3$ between the quantum dot layer and the first electrode.

Further, in order to solve the above problem, a light-emitting element of the present invention includes a first electrode, a second electrode, a quantum dot layer including layered quantum dots between the first electrode and the second electrode, and a hole transport layer formed of an inorganic material between the quantum dot layer and the first electrode, the hole transport layer having an ionization potential higher than 5.5 eV with reference to a vacuum level.

Further, in order to solve the above problem, a manufacturing apparatus of a light-emitting element of the present invention includes a film formation apparatus configured to form a first electrode, a second electrode, a quantum dot layer including layered quantum dots between the first electrode and the second electrode, and a hole transport layer formed of $LaNiO_3$ between the quantum dot layer and the first electrode.

Further, in order to solve the above problem, a manufacturing apparatus of a light-emitting element of the present invention includes a film formation apparatus configured to form a first electrode, a second electrode, a quantum dot layer including layered quantum dots between the first electrode and the second electrode, and a hole transport layer formed of an inorganic material between the quantum dot layer and the first electrode, the hole transport layer having an ionization potential higher than 5.5 eV with reference to a vacuum level.

Advantageous Effects of Invention

With the above configuration, efficiency of the transport of positive holes from the hole transport layer to the quantum dot layer is improved in the light-emitting element including the hole transport layer containing an inorganic material. This allows a balance of efficiencies of transport of the positive holes and the electrons to the quantum dot layer to be improved, and thus, it is possible to provide a light-emitting device in which luminous efficiency of the light-emitting element is improved while reliability of the light-emitting element is maintained.

DESCRIPTION OF EMBODIMENTS

Figure 1:
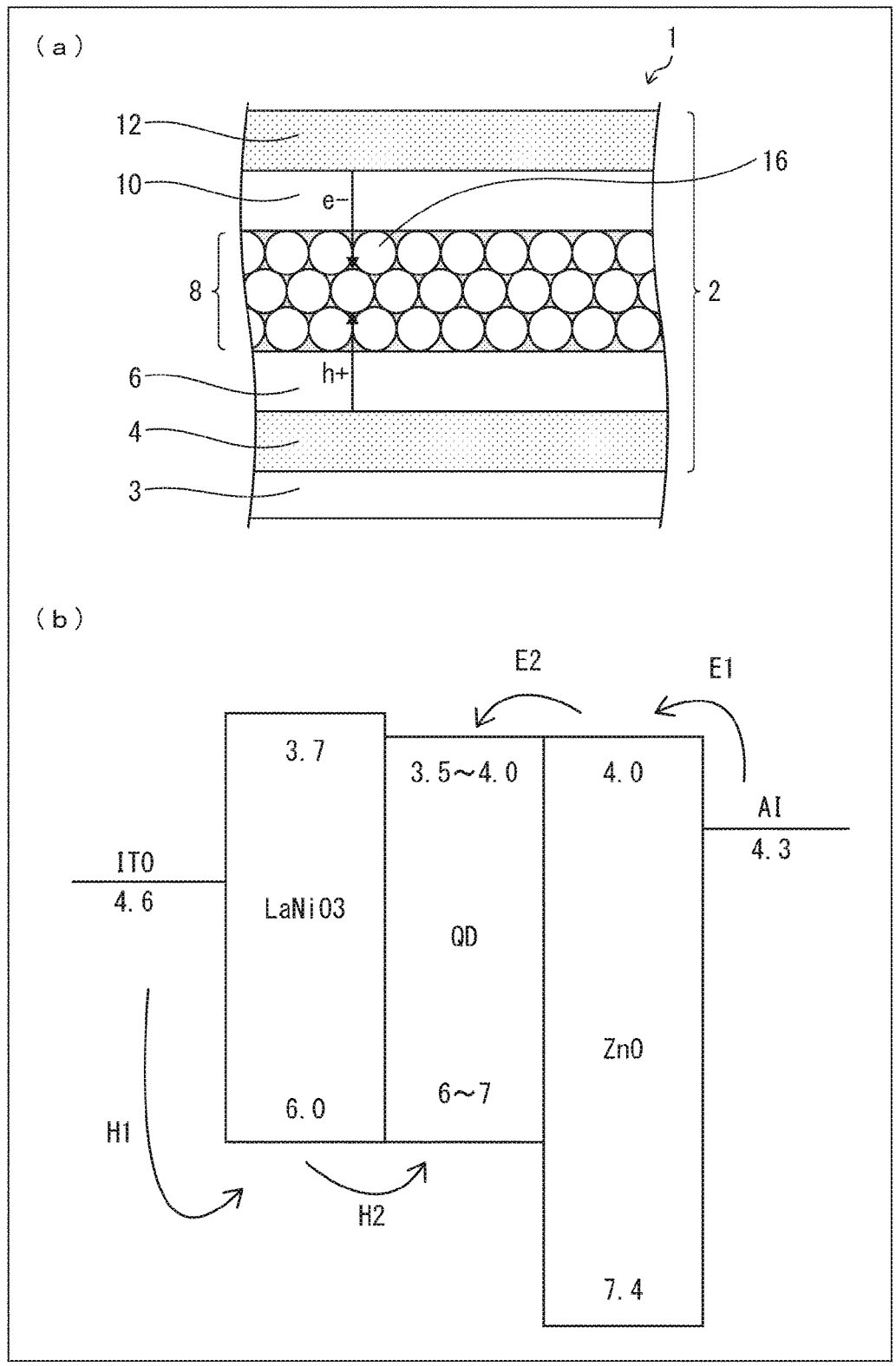
FIG. 1 is a schematic cross-sectional view of a light-emitting device according to a first embodiment of the present invention, and an energy diagram illustrating an example of a Fermi level, an electron affinity, and ionization potential of each layer in a light-emitting element of the light-emitting device.

First Embodiment (a) of FIG. 1 is a schematic cross-sectional view of a light-emitting device 1 according to the first embodiment.

As illustrated in (a) of FIG. 1, the light-emitting device 1 according to the embodiment includes a light-emitting element 2 and an array substrate 3. The light-emitting device 1 has a structure in which respective layers of the light-emitting element 2 are layered on the array substrate 3 in which a thin film transistor (TFT; not illustrated) is formed. In the present specification, a direction from the light-emitting element 2 to the array substrate 3 of the light-emitting device 1 is referred to as "downward," and a direction from the array substrate 3 of the light-emitting device 1 to the light-emitting element 2 is referred to as "upward."

The light-emitting element 2 includes a hole transport layer 6, a quantum dot layer 8, an electron transport layer 10, and a second electrode 12 on a first electrode 4 in order from a bottom layer. The first electrode 4 of the light-emitting element 2 formed in a layer on the array substrate 3 is electrically connected with TFTs of the array substrate 3.

The first electrode 4 and the second electrode 12 include conductive materials and are electrically connected to the hole transport layer 6 and the electron transport layer 10, respectively. In the embodiment, the first electrode 4 is an anode and the second electrode 12 is a cathode.

Any one of the first electrode 4 and the second electrode 12 is a transparent electrode. As the transparent electrode, for example, ITO, IZO, ZnO, AZO, or BZO may be used, and the transparent electrode may be formed as a film using a sputtering method or the like. Further, either the first electrode 4 or the second electrode 12 may contain a metal material, and the metal material is preferably Al, Cu, Au, Ag, or the like having a high reflectance of visible light.

The quantum dot layer 8 is formed by layering one to several layers of quantum dots (semiconductor nanoparticles) 16. The quantum dot layer 8 can be formed as a film from a dispersion liquid in which quantum dots 16 are dispersed in a solvent such as hexane or toluene using a spin coating method, an ink-jet method, or the like. The dispersion liquid may be mixed with a dispersion material such as thiol or amine. A film thickness of the quantum dot layer 8 is preferably from 5 to 50 nm.

The quantum dot 16 is a light-emitting material that has a valence band level and a conduction band level and emits light through recombination of positive holes in the valence band level with electrons in the conduction band level. Because light emitted from the quantum dots 16 has a narrower spectrum due to a quantum confinement effect, it is possible to obtain the emitted light with relatively deep chromaticity.

An example of the quantum dot 16 may include semiconductor nanoparticles having a core/shell structure including CdSe in a core and ZnS in a shell. In addition, the quantum dot 16 may have CdSe/CdS, InP/ZnS, ZnSe/ZnS, CIGS/ZnS, or the like as the core/shell structure.

A particle size of the quantum dots 16 is about from 3 to 15 nm. A wavelength of light emitted from the quantum dots 16 can be controlled according to the particle size of the quantum dots 16. Thus, the wavelength of the light emitted by the light-emitting device 1 can be controlled through the control of the particle size of the quantum dots 16.

The hole transport layer 6 is a layer that transports the positive holes from the first electrode 4 to the quantum dot layer 8. The hole transport layer is formed of an inorganic material, and an ionization potential with reference to a vacuum level is higher than 5.5 eV. In the embodiment, the hole transport layer 6 is formed of $LaNiO_3$. The hole transport layer 6 may be formed as a film using a sputtering method. A film thickness of the hole transport layer 6 is preferably from 5 to 40 nm.

The electron transport layer 10 is a layer that transports electrons from the second electrode 12 to the quantum dot layer 8. The electron transport layer 10 may have a function of inhibiting transport of positive holes. The electron transport layer 10 may include, for example, $ZnO$, $TiO_2$, $Ta_2O_3$, or $SrTiO_3$, and may be formed as a film using a sputtering method. A film thickness of the electron transport layer 10 can be a known film thickness and is preferably from 10 to 100 nm.

Each of the hole transport layer and the electron transport layer may be nanoparticles, crystals, polycrystals, or amorphous.

(b) of FIG. 1 is an energy diagram illustrating an example of a Fermi level, an electron affinity, and an ionization potential in each layer of the light-emitting element 2 according to the embodiment. The first electrode 4, the hole transport layer 6, the quantum dot layer 8, the electron transport layer 10, and the second electrode 12 are represented from left to right in (b) of FIG. 1.

In the first electrode 4 and the second electrode 12, a Fermi level of each of the electrodes is indicated in eV. An ionization potential of each layer with reference to the vacuum level is indicated in eV below the hole transport layer 6, the quantum dot layer 8, and the electron transport layer 10. An electron affinity of each layer with reference to the vacuum level is indicated in eV above the hole transport layer 6, the quantum dot layer 8, and the electron transport layer 10.

In the following description, both the ionization potential and the electron affinity are assumed to be based on the vacuum level when the ionization potential and the electron affinity are described simply in the present specification.

In the embodiment, as an example, a case in which the first electrode 4 is formed of ITO and the second electrode 12 is formed of Al is illustrated in (b) of FIG. 1. In this case, the Fermi level of the first electrode 4 is 4.6 eV, and the Fermi level of the second electrode 12 is 4.3 eV.

In the embodiment, the hole transport layer 6 is formed of $LaNiO_3$. Therefore, an ionization potential of the hole transport layer 6 is 6.0 eV, and an electron affinity of the hole transport layer 6 is 3.7 eV. Further, in the embodiment, as an example, a case in which the electron transport layer 10 is formed of ZnO is illustrated in (b) of FIG. 1. In this case, an ionization potential of the electron transport layer 10 is 7.4 eV, and an electron affinity of the electron transport layer 10 is 4.0 eV. Further, in the embodiment, the material and particle size of the quantum dots 16 change, but the ionization potential in the quantum dot layer 8 is from 6 to 7 eV and the electron affinity is from 3.5 to 4.0 eV.

A light emission mechanism of the light-emitting device 1 according to the embodiment will be described with reference to FIG. 1.

In the light-emitting device 1, when a potential difference is applied between the first electrode 4 and the second electrode 12, the positive holes from the first electrode 4 and the electrons from the second electrode 12 are injected toward the quantum dot layer 8. The positive holes from the first electrode 4 reach the quantum dot layer 8 via the hole transport layer 6, as indicated by an arrow h+ in (a) of FIG. 1. The electrons from the second electrode 12 reach the quantum dot layer 8 via the electron transport layer 10, as indicated by an arrow e− in (a) of FIG. 1.

The positive holes and electrons that have reached the quantum dot layer 8 are recombined at the quantum dots 16 to emit light. Light emitted from the quantum dots 16, for example, may be reflected by the second electrode, which is a metal electrode, transmitted through the first electrode 4, which is the transparent electrode, and the array substrate 3, and radiated to the outside of the light-emitting device 1.

A state in which the positive holes and the electrons are transported in each layer of the light-emitting element 2 will be described with reference to (b) of FIG. 1.

In the light-emitting device 1, when a potential difference is generated between the first electrode 4 and the second electrode 12, the positive holes are injected into the hole transport layer 6 from the first electrode 4, as indicated by an arrow H1 in (b) of FIG. 1. Similarly, the electrons are injected into the electron transport layer 10 from the second electrode 12, as indicated by an arrow E1 in (b) of FIG. 1.

The positive holes are then transported from the hole transport layer 6 to the quantum dot layer 8, as indicated by an arrow H2 in (b) of FIG. 1. Here, a barrier of the hole transport from the hole transport layer 6 to the quantum dot layer 8 is indicated by energy obtained by subtracting the ionization potential of the hole transport layer 6 from the ionization potential of the quantum dot layer 8. Therefore, the barrier of the hole transport from the hole transport layer 6 to the quantum dot layer 8 in the embodiment is from 0 to 1.0 eV.

Similarly, the electrons are transported from the electron transport layer 10 to the quantum dot layer 8, as indicated by an arrow E2 in (b) of FIG. 1. Thus, the positive holes and the electrons transported to the quantum dot layer 8 are recombined at the quantum dots 16.

Figure 2:
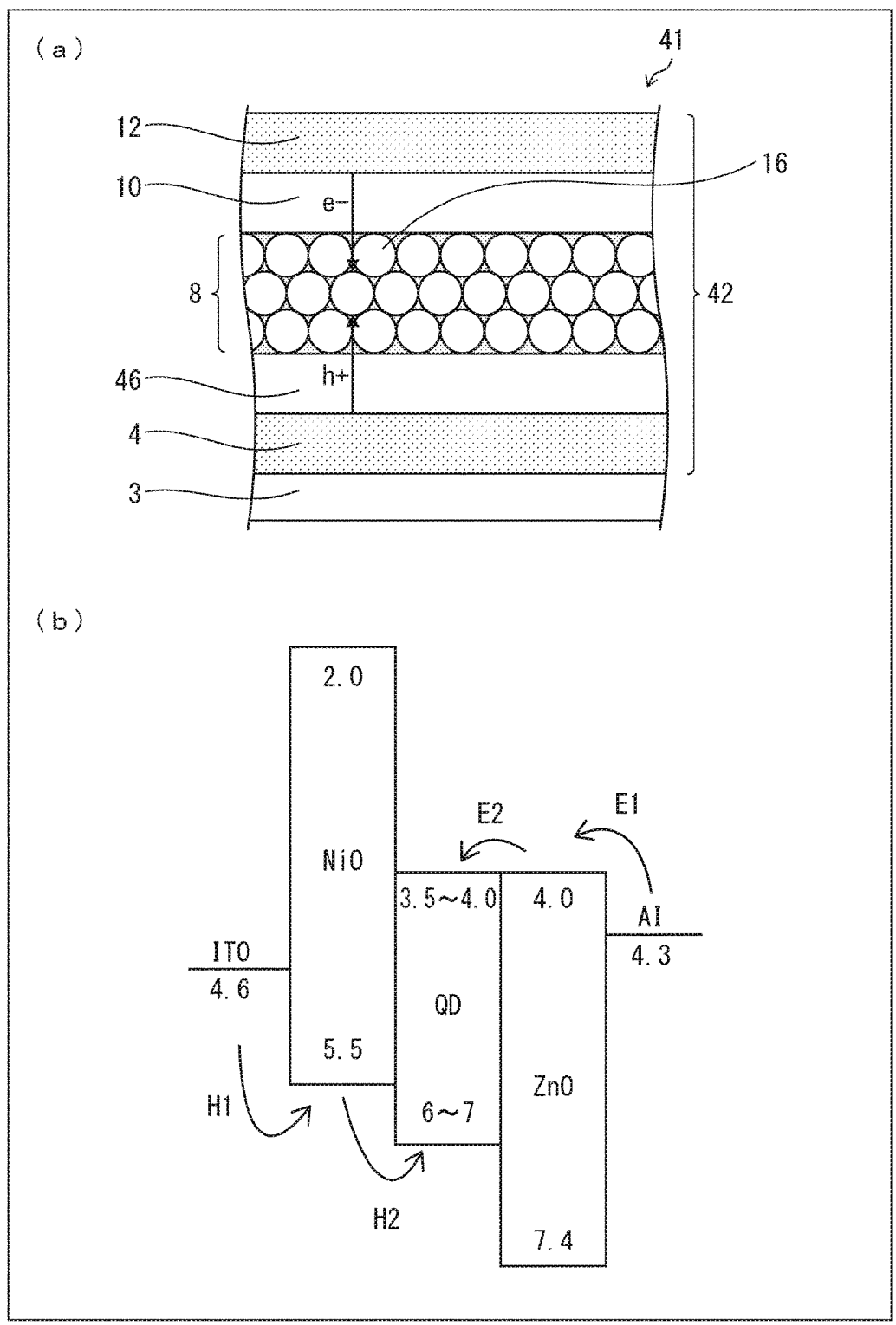
FIG. 2 is a schematic cross-sectional view of a light-emitting device according to a comparative embodiment, and an energy diagram illustrating an example of a Fermi level, an electron affinity, and an ionization potential of each layer in a light-emitting element of the light-emitting device.

FIG. 2 is a schematic cross-sectional view of a light-emitting device 41 according to a comparative embodiment, and an energy diagram illustrating an example of a Fermi level, an electron affinity, and an ionization potential of each layer in a light-emitting element 42 of the light-emitting device 41. The light-emitting device 41 according to the comparative embodiment is different in configuration from the light-emitting device 1 according to the embodiment only in that a light-emitting element 42 including a hole transport layer 46 formed of NiO is included.

The light-emitting device 41 also emits light according to the same principle as that of the embodiment. In this case, a barrier of the hole transport from the hole transport layer 46 to the quantum dot layer 8 is from 0.5 to 1.5 eV.

The light-emitting element 2 according to the embodiment includes the hole transport layer 6 that is formed of an inorganic material and has an ionization potential higher than 5.5 eV with reference to a vacuum level. Therefore, with the light-emitting element 2 according to the embodiment, it is possible to reduce the barrier of the hole transport from the hole transport layer 6 to the quantum dot layer 8, as compared with a case in which the hole transport layer 46 formed of NiO is included as in the light-emitting element 42 according to the comparative embodiment. Therefore, with the light-emitting device 1 according to the embodiment, it is possible to improve luminous efficiency while ensuring reliability.

When the hole transport layer 6 is formed of $LaNiO_3$ as in the light-emitting element 2 according to the embodiment, it is preferable for CdSe/CdS, InP/ZnS, or ZnSe/ZnS to be used as the quantum dots 16 of the quantum dot layer 8. Further, the particle size of the quantum dots 16 is preferably 5 to 10 nm. With the configuration described above, it is possible to further reduce a difference in ionization potential between the hole transport layer 6 and the quantum dot layer 8, and thus it is possible to realize the light-emitting element 2 in which the positive holes are injected into the quantum dot layer 8 more efficiently.

Further, it is preferable for the ionization potential of the hole transport layer 6 in the embodiment to be higher than the ionization potential of the quantum dot layer 8, or for a difference between the ionization potential of the hole transport layer 6 and the ionization potential of the quantum dot layer 8 to be equal to or lower than 0.5 eV. With the configuration described above, the transport barrier from the hole transport layer 6 to the quantum dot layer 8 becomes smaller, and the positive holes can be transported from the hole transport layer 6 to the quantum dot layer 8 more efficiently.

Figure 3:
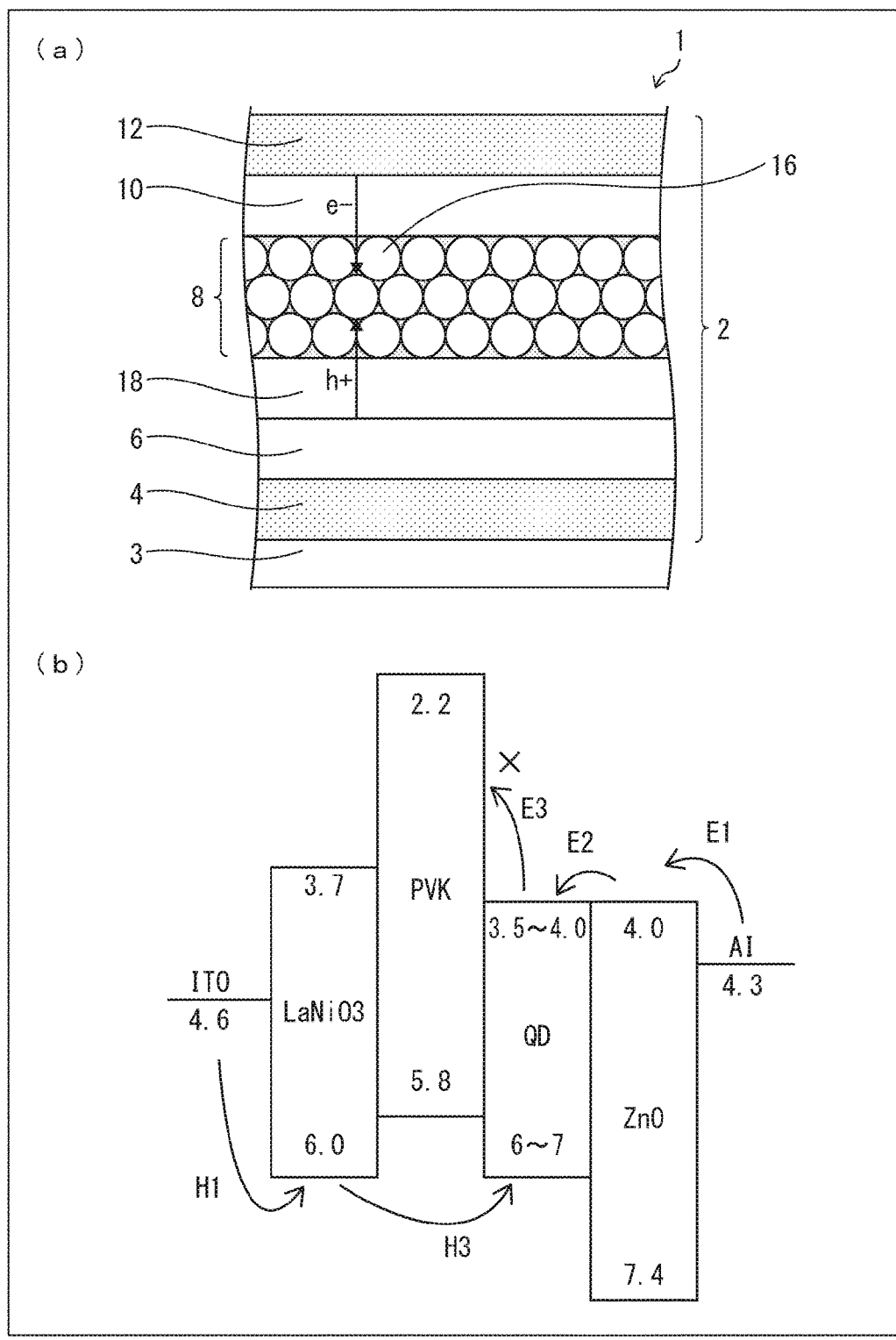
FIG. 3 is a schematic cross-sectional view of a light-emitting device according to a second embodiment of the present invention, and an energy diagram illustrating an example of a Fermi level, an electron affinity, and ionization potential of each layer in a light-emitting element of the light-emitting device.

Second Embodiment (a) of FIG. 3 is a schematic cross-sectional view of a light-emitting device 1 according to the second embodiment. The light-emitting device 1 according to the second embodiment is different in configuration from the light-emitting device 1 according to the previous embodiment only in that the light-emitting device 1 according to the second embodiment includes an electron blocking layer 18 between the hole transport layer 6 and the quantum dot layer 8.

The electron blocking layer 18 is a layer having a function of inhibiting leakage of electrons from the quantum dot layer 8 to the hole transport layer 6. The electron blocking layer 18 may contain an inorganic material such as $Cu_2O$, $LiNbO_3$, $LiCoO_2$, $Al_2O_3$, $SiO_2$, or SiN or may contain an organic material such as PVK, TFB, or poly-TPD.

(b) of FIG. 3 is an energy diagram illustrating an example of a Fermi level, an electron affinity, and an ionization potential in each layer of the light-emitting element 2 according to the embodiment. In (b) of FIG. 3, the electron blocking layer 18 is illustrated between the hole transport layer 6 and the quantum dot layer 8, unlike (b) of FIG. 1. In (b) of FIG. 3, an example in which the electron blocking layer 18 includes a PVK is illustrated. The electron blocking layer 18 in the embodiment has an ionization potential of 5.8 eV and an electron affinity of 2.2 eV, as illustrated in (b) of FIG. 3.

Thus, the electron blocking layer 18 has an electron affinity that is lower than the electron affinity of the hole transport layer 6 and the quantum dot layer 8. Further, it is preferable for the electron blocking layer 18 to have an ionization potential lower than the ionization potential of at least one of the hole transport layer 6 and the quantum dot layer 8.

A state in which positive holes and electrons are transported in each layer of the light-emitting element 2 will be described with reference to (b) of FIG. 3.

In the light-emitting device 1, when a potential difference is generated between the first electrode 4 and the second electrode 12, positive holes and electrons are injected, as in the previous embodiment. Here, in the embodiment, the positive holes transported from the first electrode 4 to the hole transport layer 6 are transported to the quantum dot layer 8, as indicated by an arrow H3. This is because, as illustrated in (b) of FIG. 3, the ionization potential of the electron blocking layer 18 is lower than the ionization potential of the hole transport layer 6 and the quantum dot layer 8, and thus the barrier of the hole transport from the hole transport layer 6 to the quantum dot layer 8 does not increase.

Further, in the embodiment, the electrons transported from the second electrode 12 to the quantum dot layer 8 via the electron transport layer 10 move further toward the electron blocking layer 18, as indicated by an arrow E3. However, because the electron blocking layer 18 has an electron affinity lower than the electron affinity of the quantum dot layer 8, a barrier of electron injection from the quantum dot layer 8 to the electron blocking layer 18 increases. Therefore, injection of the electrons transported to the quantum dot layer 8 into the electron blocking layer 18 is inhibited, and leakage of the electrons into the hole transport layer 6 and the first electrode 4 is reduced.

The light-emitting element 2 in the embodiment includes the electron blocking layer 18 that inhibits injection of electrons from the quantum dot layer 8 into the hole transport layer 6. Therefore, in the light-emitting device 1 according to the embodiment, it is possible to reduce leakage of the electrons transported to the quantum dot layer 8 to the hole transport layer 6, unlike the light-emitting device 1 of the previous embodiment. This allows the efficiency of recombination between the positive holes and the electrons in the quantum dot layer 8 to be improved, and the luminous efficiency of the light-emitting device 1 to be improved.

An electron affinity of the electron blocking layer 18 is lower than 3.5 eV, and is more preferably lower than 3.0 eV. Alternatively, the electron affinity of the electron blocking layer 18 is lower than the electron affinity of the quantum dot layer 8 by 0.5 eV or more. With the configuration described above, the electron blocking layer 18 can efficiently inhibit the leakage of the electrons described above.

Further, a film thickness of the electron blocking layer 18 is preferably from 2 to 40 nm. Further, the electron blocking layer 18 may be formed of NiO. In this case, it is preferable for the film thickness of the electron blocking layer 18 to be from 2 to 20 nm so that the positive holes transported from the hole transport layer 6 to the electron blocking layer 18 do not stay in the electron blocking layer 18.

Figure 4:
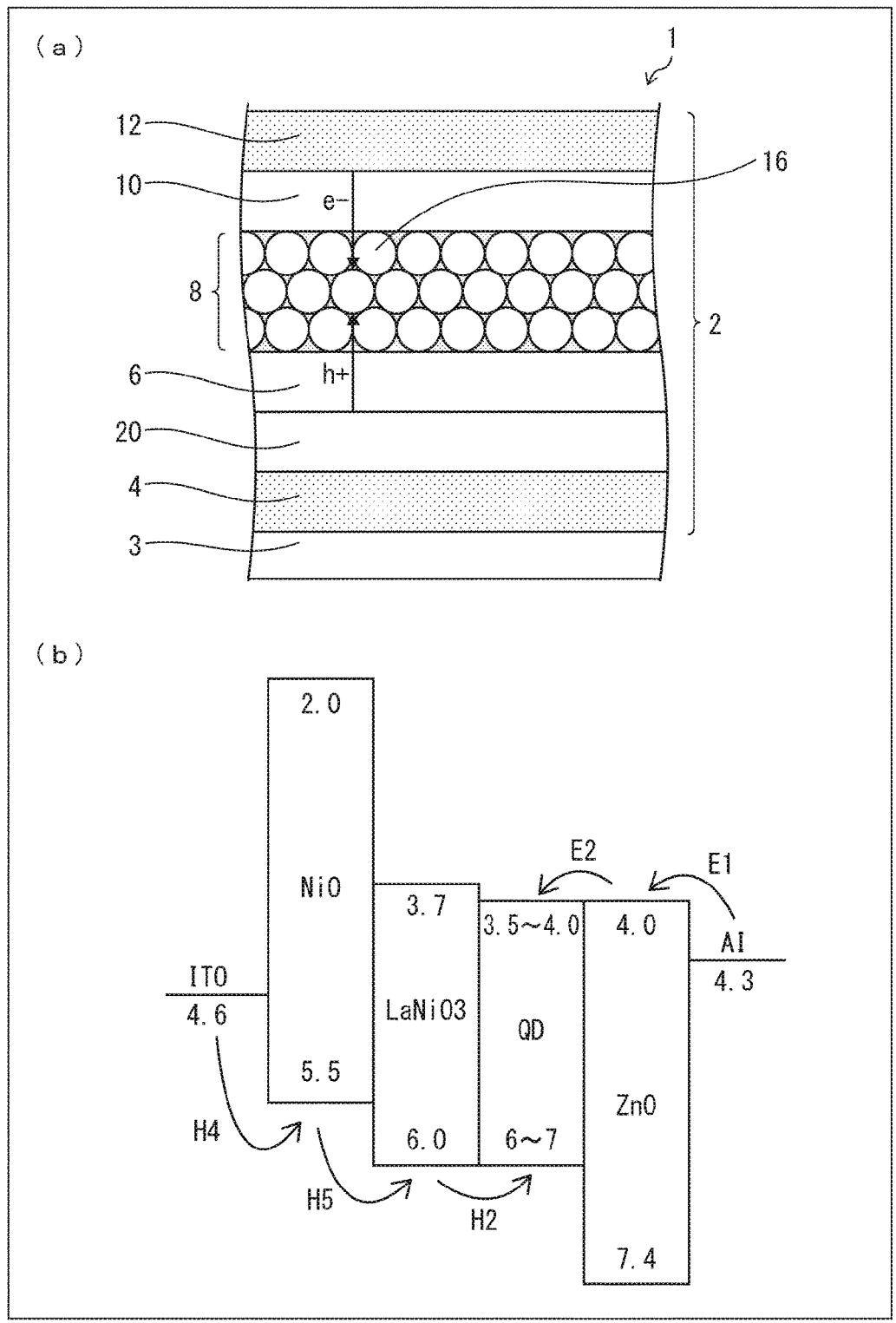
FIG. 4 is a schematic cross-sectional view of a light-emitting device according to a third embodiment of the present invention, and an energy diagram illustrating an example of a Fermi level, an electron affinity, and ionization potential of each layer in a light-emitting element of the light-emitting device.

Third Embodiment (a) of FIG. 4 is a schematic cross-sectional view of a light-emitting device 1 according to the third embodiment. The light-emitting device 1 according to the embodiment is different in configuration from the light-emitting device 1 according to the first embodiment only in that a hole injection layer 20 is provided between the first electrode 4 and the hole transport layer 6.

The hole injection layer 20 is a layer having a function of receiving positive holes injected from the first electrode 4 and injecting the positive holes into the hole transport layer 6. The hole injection layer 20 may contain, for example, NiO, $LiNbO_3$, $LiCoO_3$, or $Cu_2O$.

(b) of FIG. 4 is an energy diagram illustrating an example of a Fermi level, an electron affinity, and an ionization potential in each layer of the light-emitting element 2 according to the embodiment. In (b) of FIG. 4, the hole injection layer 20 is illustrated between the first electrode 4 and the hole transport layer 6, unlike (b) of FIG. 1. In (b) of FIG. 4, an example in which the hole injection layer 20 is formed of NiO is illustrated. The hole injection layer 20 in the embodiment has an ionization potential of 5.5 eV and an electron affinity of 2.0 eV, as illustrated in (b) of FIG. 4.

Thus, the hole injection layer 20 has an ionization potential between the Fermi level of the first electrode 4 and the ionization potential of the hole transport layer 6. A film thickness of the hole injection layer 20 is preferably from 5 to 40 nm.

A state in which positive holes and electrons are transported in each layer of the light-emitting element 2 will be described with reference to (b) of FIG. 4.

In the light-emitting device 1, when a potential difference is generated between the first electrode 4 and the second electrode 12, positive holes are injected into the hole injection layer 20 from the first electrode 4, as indicated by an arrow H4. A barrier of hole injection from the first electrode 4 to the hole injection layer 20 is 0.9 eV. The positive holes injected into the hole injection layer 20 are then injected into the hole transport layer 6 from the hole injection layer 20, as indicated by an arrow H5. A barrier of the hole injection from the hole injection layer 20 to the hole transport layer 6 is 0.5 eV. Subsequent transport of positive holes and electrons may be performed as in the first embodiment.

In the light-emitting element 2 of the embodiment, transport of positive holes from the first electrode 4 to the hole transport layer 6 is performed via the hole injection layer 20. A barrier of hole injection from the first electrode 4 into the hole injection layer 20 and a barrier of the hole injection from the hole injection layer 20 to the hole transport layer 6 are smaller than the barrier of the hole injection from the first electrode 4 to the hole transport layer 6, as can be seen from a comparison of (b) of FIG. 1 and (b) of FIG. 4. Thus, it is possible to efficiently perform the transport of the positive holes from the first electrode 4 to the hole transport layer 6.

Therefore, in the light-emitting device 1 according to the embodiment, it is possible to inject the positive holes into the quantum dot layer 8 more efficiently and to improve the luminous efficiency of the light-emitting device 1, as compared with the light-emitting device 1 according to the previous embodiment.

Figure 5:
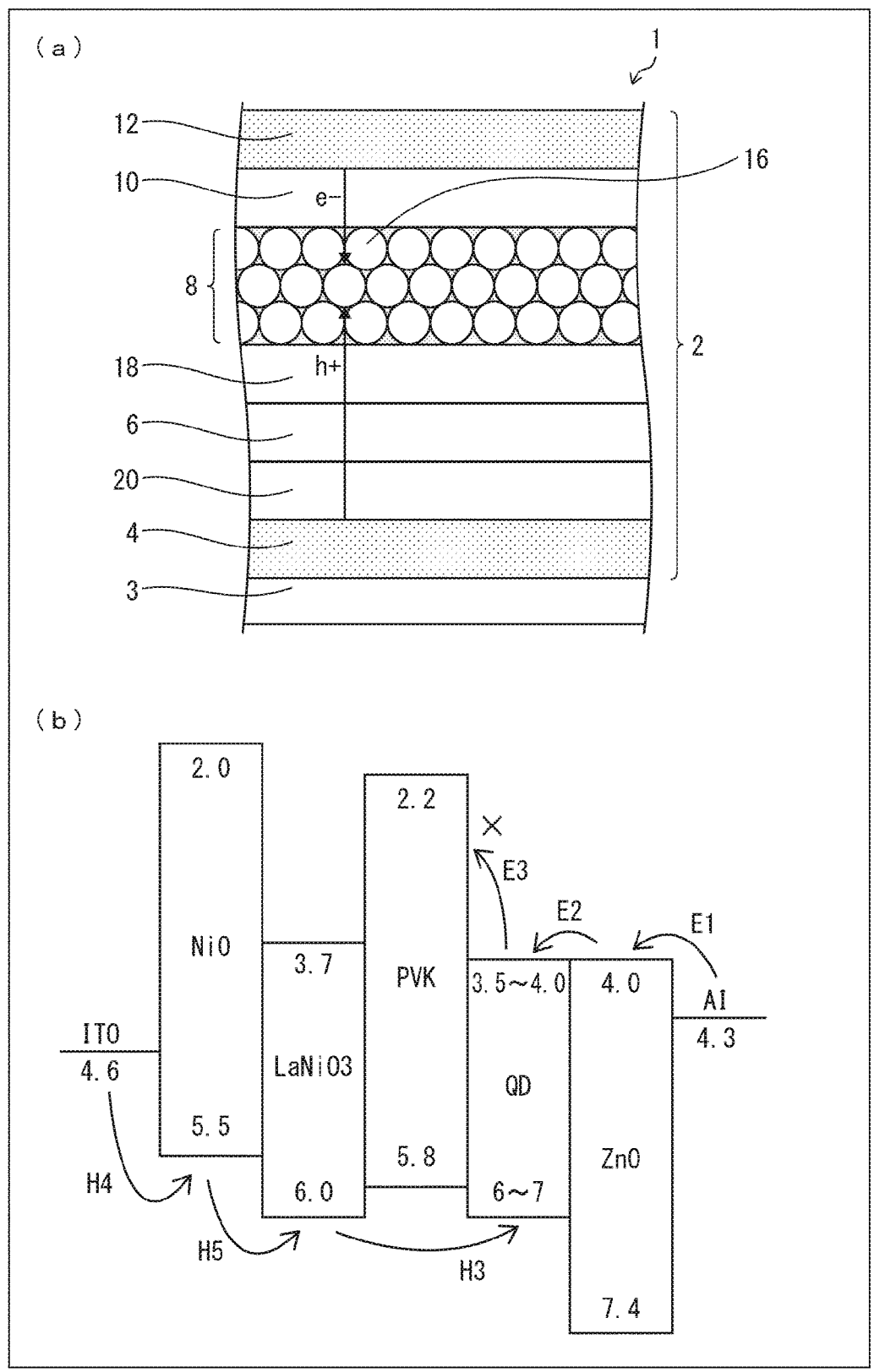
FIG. 5 is a schematic cross-sectional view of a light-emitting device according to a modification example of the third embodiment of the present invention, and an energy diagram illustrating an example of a Fermi level, an electron affinity, and an ionization potential of each layer in a light-emitting element of the light-emitting device.

FIG. 5 is a schematic cross-sectional view of a light-emitting device 1 according to a modification example of the third embodiment, and an energy diagram illustrating an example of a Fermi level, an electron affinity, and an ionization potential of each layer in a light-emitting element 2 of the light-emitting device 1. The light-emitting device 1 according to the modification example is different in configuration from the light-emitting device 1 according to the embodiment only in that the light-emitting device 1 according to the modification example includes an electron blocking layer 18 between the hole transport layer 6 and the quantum dot layer 8.

In the transport of the positive holes in the light-emitting element 2 according to the modification example, positive holes are first injected into the hole transport layer 6 from the first electrode 4 via the hole injection layer 20, as in the light-emitting element 2 according to the embodiment. The positive holes are then transported from the hole transport layer 6 to the quantum dot layer 8, as in the light-emitting element 2 according to the second embodiment. In the transport of the electrons in the light-emitting element 2 according to the modification example, the electrons are transported from the second electrode 12 to the quantum dot layer 8 via the electron transport layer 10, as in the light-emitting element 2 according to the second embodiment. Injection of the electrons transported to the quantum dot layer 8 into the hole transport layer 6 is inhibited by the electron blocking layer 18.

The light-emitting device 1 according to the modification example inhibits the injection of the electrons from the quantum dot layer 8 into the hole transport layer 6 while maintaining efficiency of the transport of the positive holes to the quantum dot layer 8, similar to the light-emitting device 1 according to the embodiment. Therefore, it is possible to further improve the efficiency of recombination between the positive holes and the electrons in the quantum dot layer 8, and to further improve the luminous efficiency of the light-emitting device 1.

Figure 6:
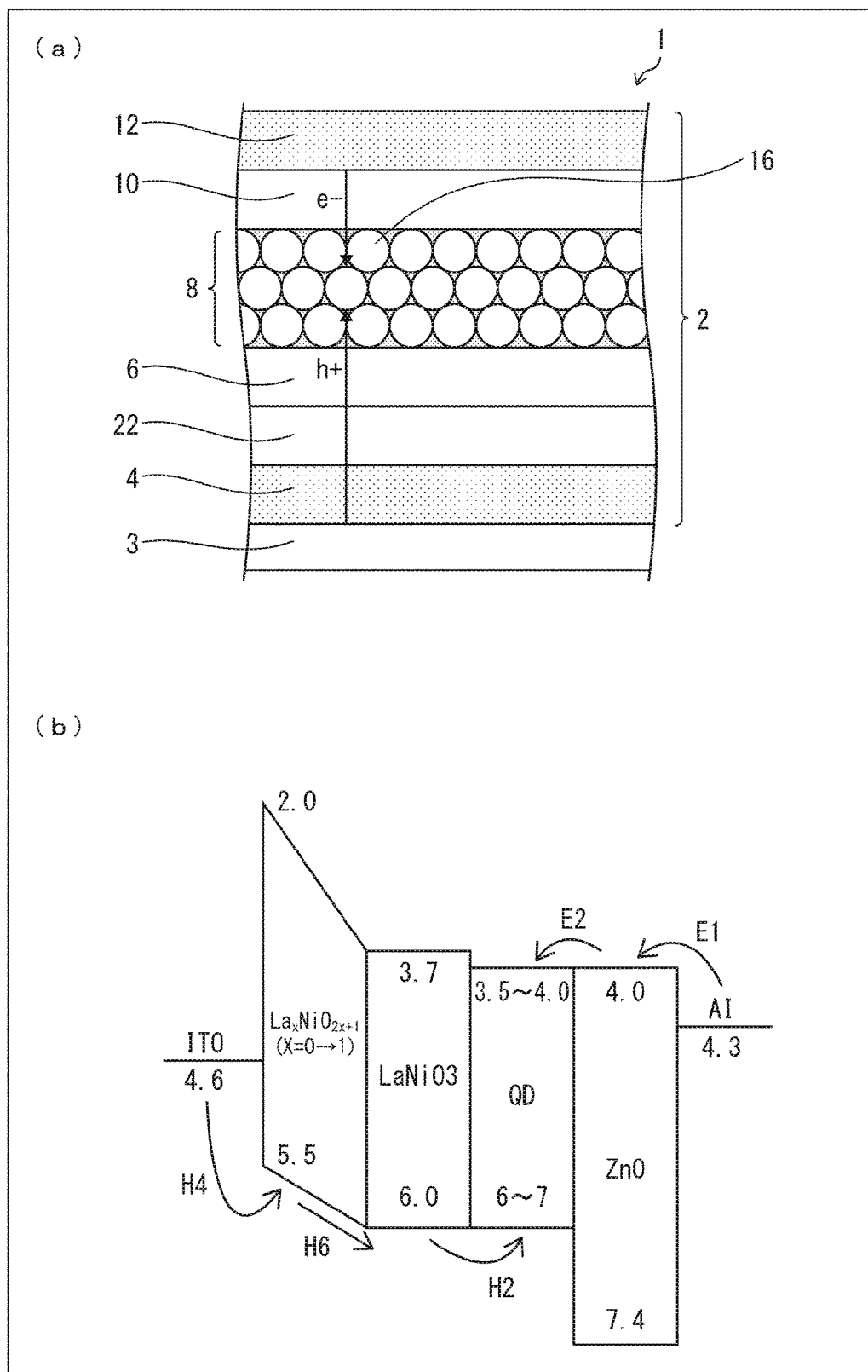
FIG. 6 is a schematic cross-sectional view of a light-emitting device according to a fourth embodiment of the present invention, and an energy diagram illustrating an example of a Fermi level, an electron affinity, and ionization potential of each layer in a light-emitting element of the light-emitting device.

Fourth Embodiment (a) of FIG. 6 is a schematic cross-sectional view of a light-emitting device 1 according to the fourth embodiment. The light-emitting device 1 according to the fourth embodiment is different in configuration from the light-emitting device 1 according to the third embodiment only in that the light-emitting device 1 according to the fourth embodiment includes a hole injection layer 22 in place of the hole injection layer 20.

The hole injection layer 22 is formed of NiO and LaNiO$_3$. In the hole injection layer 22, the density of NiO gradually decreases and the density of LaNiO$_3$ gradually increases from an end surface on the first electrode 4 side to an end surface on the hole transport layer 6 side. That is, the hole injection layer 22 has a structure in which the end surface in contact with the first electrode 4 is formed of NiO, NiO is gradually replaced with LaNiO$_3$ toward the hole transport layer 6, and the end surface in contact with the hole transport layer 6 is formed of LaNiO$_3$. In other words, when a variable X having a value gradually increasing from 0 to 1 from the first electrode 4 to the hole transport layer 6 is used, the hole injection layer 22 may have a structure represented by La$_X$NiO$_{2X+1}$. In the embodiment, the hole transport layer 6 may be formed continuously with the hole injection layer 22. A film thickness of the hole injection layer 22 is preferably from 5 to 40 nm.

The hole injection layer 22 can be produced by simultaneously sputtering NiO and LaO. For example, power of a sputtering device that forms a film of NiO may be made constant and power of a sputtering device that forms a film of LaO may be gradually increased such that NiO and LaO are sputtered simultaneously.

(b) of FIG. 6 is an energy diagram illustrating an example of a Fermi level, an electron affinity, and an ionization potential in each layer of the light-emitting element 2 according to the embodiment. In (b) of FIG. 6, a hole injection layer 22 is illustrated in place of the hole injection layer 20, unlike (b) of FIG. 4.

In the hole injection layer 22 according to the embodiment, a composition is replaced from NiO to LaNiO$_3$ from the end surface on the first electrode 4 side to the end surface on the hole transport layer 6 side. Reflecting this, an apparent ionization potential of the hole injection layer 22 increases from 5.5 eV to 6.0 eV from the first electrode 4 to the hole transport layer 6, as illustrated in (b) of FIG. 6. Further, an apparent electron affinity of the hole injection layer 22 also increases from 2.0 eV to 3.7 eV from the first electrode 4 to the hole transport layer 6, as illustrated in (b) of FIG. 6.

A state in which the positive holes and the electrons are transported in each layer of the light-emitting element 2 will be described with reference to (b) of FIG. 6.

In the light-emitting device 1, when a potential difference is generated between the first electrode 4 and the second electrode 12, the positive holes are injected into the hole injection layer 22 from the first electrode 4, as indicated by an arrow H4. The positive holes injected into the hole injection layer 22 are then transported in the hole injection layer 22 from the first electrode 4 to the hole transport layer 6, as indicated by an arrow H6.

Because the apparent ionization potential in the hole injection layer 22 continuously increases, a barrier of the hole transport in the hole injection layer 22 is small. Further, since an ionization potential between an end surface of the hole injection layer 22 on the hole transport layer 6 side and the hole transport layer 6 does not substantially change, a barrier of the hole injection from the hole injection layer 22 to the hole transport layer 6 is very small.

Therefore, the positive holes are injected into the hole transport layer 6 from the first electrode 4 via the hole injection layer 22. Subsequent transport of the positive holes and the electrons may be performed as in the first embodiment.

In the light-emitting element 2 of the embodiment, the transport of the positive holes from the first electrode 4 to the hole transport layer 6 is performed via the hole injection layer 22. Therefore, injection of the positive holes from the hole injection layer 22 into the hole transport layer 6 is performed more efficiently. Therefore, in the light-emitting device 1 according to the embodiment, it is possible to transport the positive holes to the quantum dot layer 8 more efficiently, and to improve the luminous efficiency of the light-emitting device 1, as compared with the light-emitting device 1 in the previous embodiment.

Figure 7:
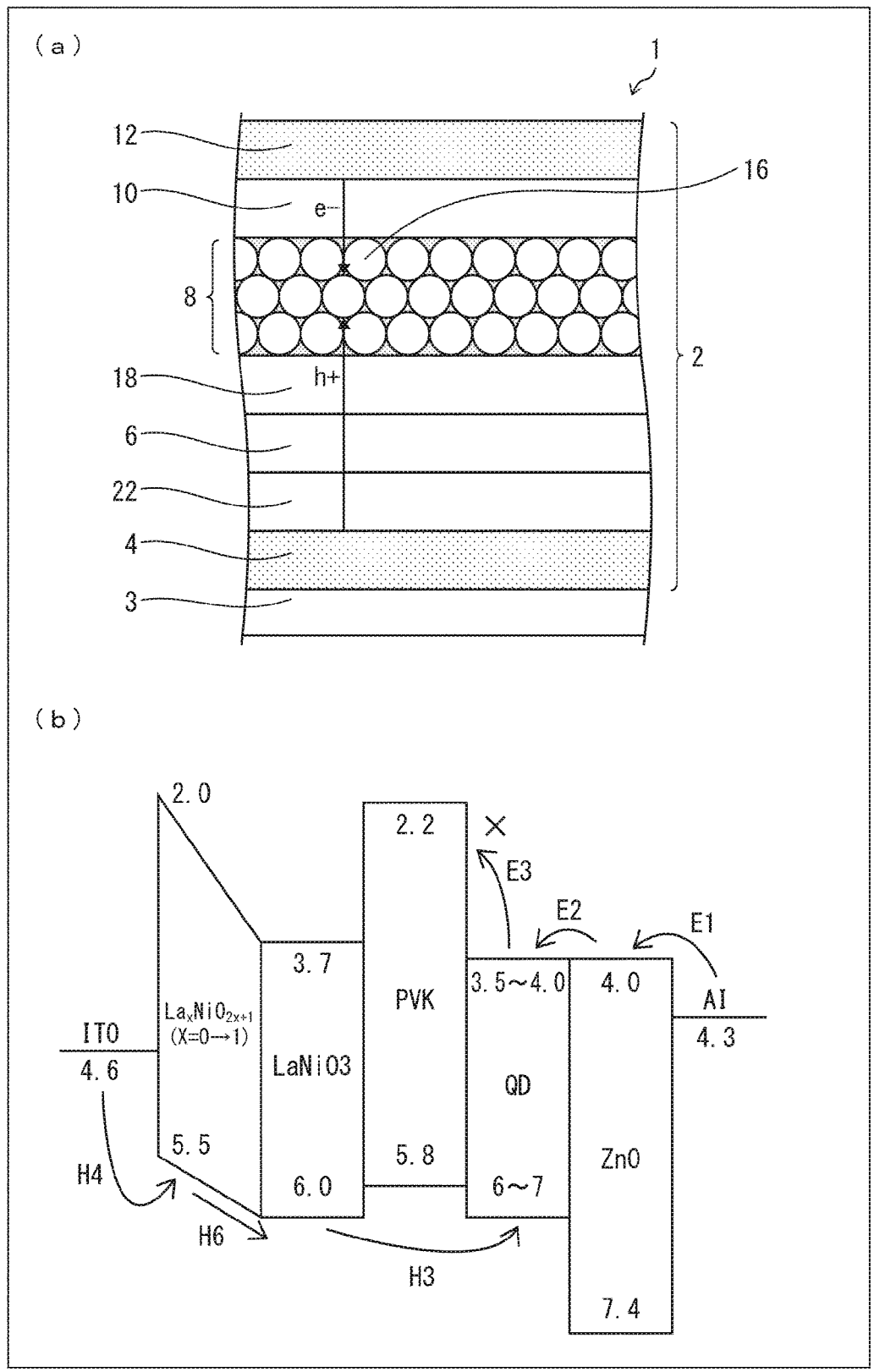
FIG. 7 is a schematic cross-sectional view of a light-emitting device according to a modification example of the fourth embodiment of the present invention, and an energy diagram illustrating an example of a Fermi level, an electron affinity, and ionization potential of each layer in a light-emitting element of the light-emitting device.

FIG. 7 is a schematic cross-sectional view of the light-emitting device 1 according to a modification example of the embodiment, and an energy diagram illustrating an example of a Fermi level, an electron affinity, and an ionization potential of each layer in the light-emitting element 2 of the light-emitting device 1. The light-emitting device 1 according to the modification example is different in configuration from the light-emitting device 1 according to the embodiment only in that the light-emitting device 1 according to the modification example includes an electron blocking layer 18 between the hole transport layer 6 and the quantum dot layer 8.

In the transport of the positive holes in the light-emitting element 2 according to the modification example, the positive holes are first injected into the hole transport layer 6 from the first electrode 4 via the hole injection layer 22, as in the light-emitting element 2 according to the embodiment. The positive holes are then transported from the hole transport layer 6 to the quantum dot layer 8, as in the light-emitting element 2 according to the second embodiment. In the transport of the electrons in the light-emitting element 2 according to the modification example, the electrons are injected into the quantum dot layer 8 from the second electrode 12 via the electron transport layer 10, as in the light-emitting element 2 according to the second embodiment. Injection of the electrons injected into the quantum dot layer 8 into the hole transport layer 6 is inhibited by the electron blocking layer 18.

The light-emitting device 1 according to the modification example inhibits the injection of the electrons from the quantum dot layer 8 into the hole transport layer 6 while maintaining efficiency of the transport of the positive holes to the quantum dot layer 8, similar to the light-emitting device 1 according to the embodiment. Therefore, it is possible to further improve the efficiency of recombination between the positive holes and the electrons in the quantum dot layer 8, and to further improve the luminous efficiency of the light-emitting device 1.

The light-emitting device 1 having a structure including the light-emitting element 2 including the first electrode, the hole transport layer, the quantum dot layer, the electron transport layer, and the second electrode in order from a bottom layer on the array substrate 3 has been described by way of example in each of the above-described embodiments. However, each of the above-described embodiments can also be applied to a light-emitting device 1 having a structure including a light-emitting element 2 including the respective layers in reverse order, that is, the second electrode, the electron transport layer, the quantum dot layer, the hole transport layer, and the first electrode, in order from the bottom layer on the array substrate 3.

Figure 8:
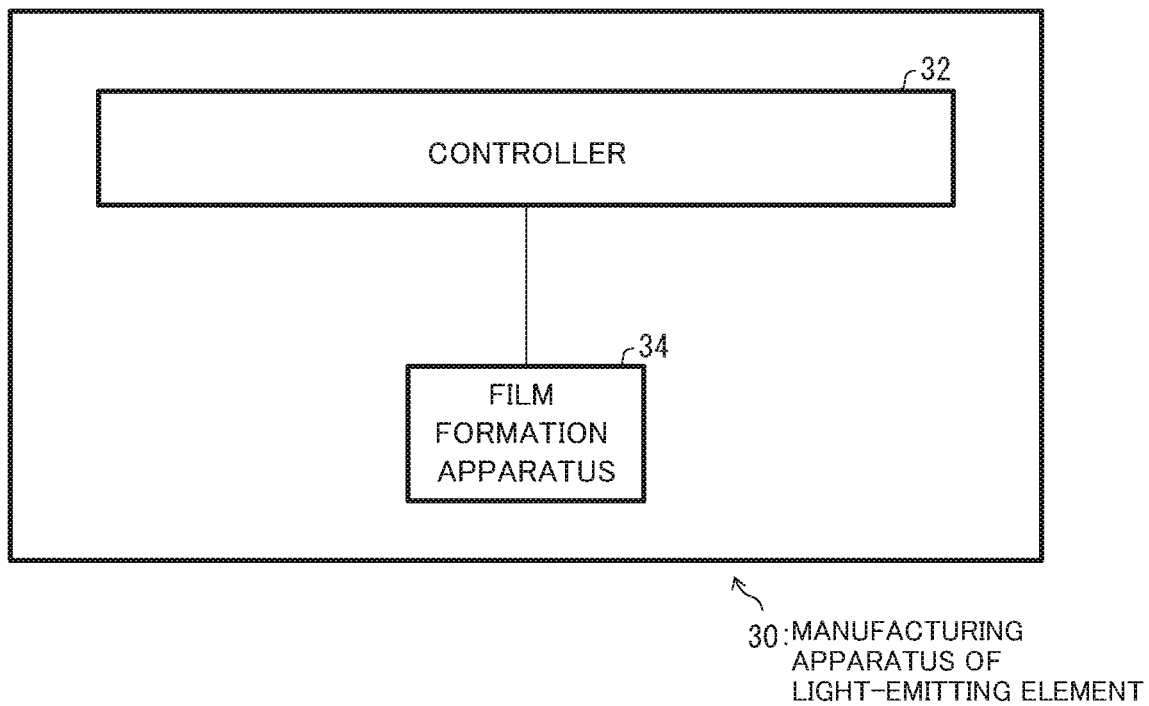
FIG. 8 is a block diagram illustrating a manufacturing apparatus of a light-emitting element according to the embodiments of the present invention.

FIG. 8 is a block diagram illustrating a manufacturing apparatus of a light-emitting element 30 according to the embodiments. The manufacturing apparatus of a light-emitting element 30 may include a controller 32 and a film formation apparatus 34. The controller 32 may control the film formation apparatus 34. The film formation apparatus 34 may form each layer of the light-emitting element 2.

Supplement

The light-emitting element according to aspect 1 includes a first electrode, a second electrode, a quantum dot layer including layered quantum dots between the first electrode and the second electrode, and a hole transport layer formed of $LaNiO_3$ between the quantum dot layer and the first electrode.

The light-emitting element according to aspect 2 includes a first electrode, a second electrode, a quantum dot layer including layered quantum dots between the first electrode and the second electrode, and a hole transport layer formed of an inorganic material between the quantum dot layer and the first electrode, the hole transport layer having an ionization potential higher than 5.5 eV with reference to a vacuum level.

In aspect 3, the ionization potential of the hole transport layer is higher than an ionization potential of the quantum dot layer, or a difference in ionization potential between the quantum dot layer and the hole transport layer is equal to or lower than 0.5 eV.

In aspect 4, an electron blocking layer is included between the quantum dot layer and the hole transport layer, and an electron affinity of the electron blocking layer is lower than an electron affinity of the hole transport layer.

In aspect 5, the electron affinity of the electron blocking layer is lower than an electron affinity of the quantum dot layer by 0.5 eV or more.

In aspect 6, the electron affinity of the electron blocking layer is lower than 3.5 eV with reference to a vacuum level.

In aspect 7, a hole injection layer is included between the first electrode and the hole transport layer, and an ionization potential of the hole injection layer is between a Fermi level of the first electrode and the ionization potential of the hole transport layer.

In aspect 8, the hole injection layer is formed of NiO and $LaNiO_3$, and in the hole injection layer, the density of NiO gradually decreases and the density of $LaNiO_3$ gradually increases from an end surface on the first electrode side to an end surface on the hole transport layer side.

The light-emitting device according to aspect 9 includes the light-emitting element in any one of the above-described aspects.

A manufacturing apparatus of a light-emitting element according to aspect 10 includes a film formation apparatus configured to form a first electrode, a second electrode, a quantum dot layer including layered quantum dots between the first electrode and the second electrode, and a hole transport layer formed of $LaNiO_3$ between the quantum dot layer and the first electrode.

A manufacturing apparatus of a light-emitting element according to aspect 11 includes a film formation apparatus configured to form a first electrode, a second electrode, a quantum dot layer including layered quantum dots between the first electrode and the second electrode, and a hole transport layer formed of an inorganic material between the quantum dot layer and the first electrode, the hole transport layer having an ionization potential higher than 5.5 eV with reference to a vacuum level.

The present invention is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

REFERENCE SIGNS LIST

1 Light-emitting device
2 Light-emitting element
4 First electrode
6 Hole transport layer
8 Quantum dot layer
12 Second electrode
16 Quantum dot
18 Electron blocking layer
20, 22 Hole injection layer
30 Manufacturing apparatus of light-emitting element

The invention claimed is:

1. A light-emitting element comprising:
a first electrode;
a second electrode;
a quantum dot layer including layered quantum dots between the first electrode and the second electrode; and
a hole transport layer including $LaNiO_3$ between the quantum dot layer and the first electrode.

2. The light-emitting element according to claim 1, wherein the ionization potential of the hole transport layer is higher than an ionization potential of the quantum dot layer, or a difference in ionization potential between the quantum dot layer and the hole transport layer is equal to or lower than 0.5 eV.

3. The light-emitting element according to claim 1, further comprising:
an electron blocking layer between the quantum dot layer and the hole transport layer,
wherein an electron affinity of the electron blocking layer is lower than an electron affinity of the hole transport layer.

4. The light-emitting element according to claim 3, wherein the electron affinity of the electron blocking layer is lower than an electron affinity of the quantum dot layer by 0.5 eV or greater.

5. The light-emitting element according to claim 3, wherein the electron affinity of the electron blocking layer is lower than 3.5 eV with reference to a vacuum level.

6. The light-emitting element according to claim 1, further comprising:
a hole injection layer between the first electrode and the hole transport layer,
wherein an ionization potential of the hole injection layer is between a Fermi level of the first electrode and the ionization potential of the hole transport layer.

7. The light-emitting element according to claim 6, wherein the hole injection layer includes NiO and $LaNiO_3$, and in the hole injection layer, a density of NiO gradually decreases and a density of $LaNiO_3$ gradually increases from an end surface on the first electrode side to an end surface on the hole transport layer side.

8. A manufacturing apparatus of a light-emitting element comprising a film forming apparatus configured to form a first electrode, a second electrode, a quantum dot layer including layered quantum dots between the first electrode and the second electrode, and a hole transport layer including $LaNiO_3$ between the quantum dot layer and the first electrode.

9. A light-emitting element comprising:
a first electrode;
a second electrode;
a quantum dot layer including layered quantum dots between the first electrode and the second electrode;
a hole transport layer including an inorganic material between the quantum dot layer and the first electrode, the hole transport layer having an ionization potential higher than 5.5 eV with reference to a vacuum level; and
a hole injection layer between the first electrode and the hole transport layer,
wherein an ionization potential of the hole injection layer is between a Fermi level of the first electrode and the ionization potential of the hole transport layer.

* * * * *